United States Patent [19]

Limb et al.

[11] Patent Number: 5,352,615
[45] Date of Patent: Oct. 4, 1994

[54] DENUDING A SEMICONDUCTOR SUBSTRATE

[75] Inventors: Young Limb; Philip J. Tobin, both of Austin, Tex.

[73] Assignee: Motorola, Inc., Schaumburg, Ill.

[21] Appl. No.: 185,351

[22] Filed: Jan. 24, 1994

[51] Int. Cl.$^5$ .......................................... H01L 21/306
[52] U.S. Cl. ................... 437/13; 148/DIG.60
[58] Field of Search ................... 437/13, 12; 148/DIG. 60; 156/DIG. 66

[56] References Cited

U.S. PATENT DOCUMENTS

| | | | |
|---|---|---|---|
| 4,548,654 | 10/1985 | Tobin | 148/1.5 |
| 4,661,166 | 4/1987 | Hinao | 437/13 |
| 4,868,133 | 9/1989 | Huber | 148/DIG. 60 |
| 4,931,405 | 6/1990 | Kamijo et al. | 437/12 |
| 5,110,404 | 5/1992 | Fusegawa et al. | 437/12 |

OTHER PUBLICATIONS

Weast, et al.; CRC Handbook of Chemistry and Physics; p. D-122 (1979).
Matsushita, et al.; "Improvement of Silicon Surface Quality by H2 Anneal;" 18th Conference on Solid State Devices and Materials; pp. 529-532 (1986).
Kirino, et al.; "H2-Annealed CZ Wafer Brought to the Practical Level . . . ;" Nikkei Microdevices; pp. 46-53 (Jun. 1993).
Kubota, et al.; "Oxygen Precipitation Enhancement in Polysilicon Deposited CZ-Si by Metal Contamination;" Extended Abstracts-Electrochem. Soc.; pp. 279-280 (Oct. 10-15, 1993).
Sawata, et al.; "Hydrogen Annealing of Silicon Wafer;" Extended Abstracts-Electrochem. Soc.; pp. 426-427 (Oct. 10-15, 1993).

*Primary Examiner*—Olik Chaudhuri
*Assistant Examiner*—Savitri Mulpuri
*Attorney, Agent, or Firm*—George R. Meyer

[57] ABSTRACT

A semiconductor substrate is denuded using a reducing gas mixture including carbon monoxide and carbon dioxide. Use of the reducing gas mixture allows very low oxygen partial pressure to be achieved in a furnace tube during the step of denuding. Oxygen partial pressure lower than 1E-9 atmosphere may be achieved by adjusting the relative ratio of carbon monoxide and carbon dioxide. Precipitates are grown after forming nucleating sites. Both CZ and FZ substrates may use the process, and the process can be used with silicon, germanium, or other semiconductor materials.

18 Claims, 1 Drawing Sheet

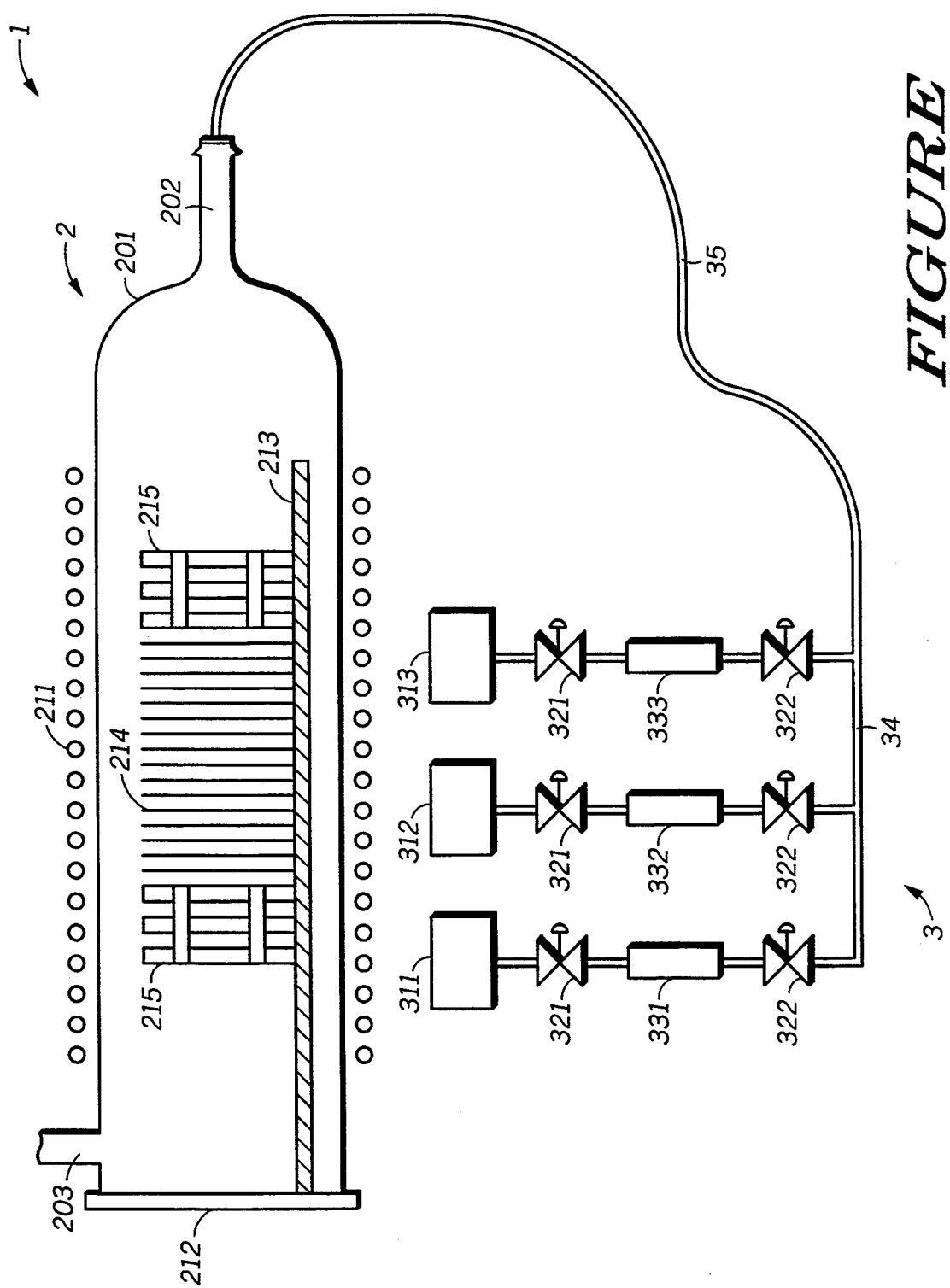
FIGURE

5,352,615

DENUDING A SEMICONDUCTOR SUBSTRATE

FIELD OF THE INVENTION

The present invention relates to denuding semiconductor substrates, and in particular, to denuding semiconductor substrates using a reducing ambient.

BACKGROUND OF THE INVENTION

Today, Czochralski-grown (CZ) silicon substrates are the most commonly used substrates in making semiconductor devices. The CZ-grown silicon substrates typically contain 25-35 parts per million atomic (ppma) of oxygen, virtually all of which is interstitial (between silicon lattice sites). The oxygen can form precipitates and generate crystal defects in the silicon substrates during thermal processing steps. The precipitates and related crystal defects within the device active region may cause device degradation and need to be reduced or eliminated within the active region of the devices.

Typically, the oxygen concentration in the active region of the substrate is reduced by the performing a furnace cycle to form a denuded zone. During the heating, the oxygen near the surface of the silicon substrates diffuses out of the substrates. The step is usually performed with an inert gas with or without an oxygen bleed. The use of an oxygen bleed actually inhibits denuding (that is a type of diffusion process) relative to using an inert gas without an oxygen bleed. However, using only an inert gas during the denuding also has problems. An inert gas typically contains more than one part per million of oxygen. Even at this concentration, denuding is still inhibited. Also, substrate pitting may occur. The pitting is believe to be caused by the substrate reacting with oxygen to form a volatile silicon-oxygen compound.

An attempt to denude the substrate without inhibiting denuding or causing pitting is to use hydrogen during the denuding process. Unfortunately, hydrogen is flammable. The lower flammability limit of hydrogen in air is about 4.65 percent. Also, hydrogen is more difficult to seal within a chamber compared to relatively heavier gases, such as nitrogen or oxygen. In order to overcome the problems, a special and expensive furnace is used for the hydrogen-based denuding process. As a result, the cost of the hydrogen-based denuding process is high.

SUMMARY OF THE INVENTION

The present invention includes a process for denuding a semiconductor substrate. The semiconductor substrate has a primary surface and an oxygen concentration in a region adjacent to the primary surface. The semiconductor substrate is heated to an elevated temperature in a reducing ambient that includes carbon-containing molecules to lower the oxygen concentration within the region.

Other features and advantages of the present invention will be apparent from the accompanying drawings and from the detailed description that follows.

BRIEF DESCRIPTION OF THE DRAWINGS

The present invention is illustrated by way of example and not limitation in the figure of the accompanying drawing, in which like references indicate similar elements, and in which the FIGURE includes a schematic drawing of a furnace system for use in denuding substrates in accordance with the present invention.

DETAILED DESCRIPTION OF EMBODIMENTS

Silicon substrates are typically grown by two different techniques: Czochralski (CZ) and float zone (FZ) methods. The CZ-grown silicon substrates may contain 25-35 ppma of oxygen, virtually all of which is interstitial. The oxygen concentration is typically uniform throughout the substrate including within regions where a denuded zone is subsequently formed. The FZ-grown silicon substrates have smaller concentrations of oxygen. A denuded zone is formed by a step of denuding and is at least three microns deep and is formed at the primary surface. After denuding, the oxygen concentration within the denuded zone should be no higher than one ppma. Embodiments described below use a reducing gas mixture including carbon monoxide (CO) and carbon dioxide ($CO_2$). The present invention is better understood with the embodiments described below.

Denuding Semiconductor Substrates

A diffusion furnace system 1 includes a tube assembly 2 and a gas jungle 3 as shown in FIGURE. The tube assembly 2 includes a furnace tube 201 having a processing gas inlet 202 and a gas outlet 203. The gas outlet 203 is vented to an exhaust system (not shown) that properly disposes of any CO that is used during the denuding process. The furnace tube 201 is surrounded by a furnace element 211. The furnace tube 201 includes at least one very pure material that can withstand or is not susceptible to molecular breakdown in ultra low oxygen partial pressures at denuding temperatures. For example, the material should not break down when the oxygen partial pressure within the furnace tube 201 is 1E-18 atmosphere at 1250 degrees Celsius. Further, the purity of the tube materials must be high enough not to cause a metallic contamination problem to the substrates during the process. Silicon carbide may be used for the furnace tube 201. High-purity polysilicon is another possible option.

The jungle 3 includes three gases: CO gas 311, $CO_2$ gas 312, and an inert gas 313 (argon, helium, nitrogen, or the like). The jungle 3 may include other gases (not shown) if the furnace system 1 is used for other diffusion or oxidation processes. Each of the gas lines include an upstream valve 321 and a downstream valve 322. The gas flow through each of the gas lines is determined by mass flow controllers (MFCs) 331-333. Each of the MFCs 331-333 is calibrated for the gas which flows through that particular gas line. Assuming the inert gas is argon, MFC 331 is calibrated for CO, MFC 332 is calibrated for $CO_2$, and MFC 333 is calibrated for argon. The gases from each of the gas lines is combined within a gas header 34. A flexible gas line 35 connects the header 34 with the processing gas inlet 202 for the tube assembly 2.

The furnace tube 201 is preheated to an idling temperature with the inert gas 313 flowing into the furnace tube 201. For example, the temperature may be 600-800 degrees Celsius and the inert gas is argon. Prior to processing, the door assembly is outside of the furnace tube 201. The door assembly includes an endplate 212 with a paddle 213 attached to it. A plurality of CZ-grown silicon substrates 214 are loaded into boats (not shown) and placed on the paddle 213. The substrates 214 have an initial oxygen concentration of about 25-35 ppma. The substrates 214 are positioned, so that the substrates 214 will lie within the central heating zone of the furnace tube 201 when the substrates 214 are subsequently inserted into the furnace tube 201. Before and after the substrates 214 are baffles 215. The substrates 214 are inserted into the furnace tube 201, and the endplate 212 is pressed against the furnace tube 201. A fifteen minute stabilization period allows the substrates 214 to get closer to the idling temperature before further processing occurs.

After the fifteen minute stabilization period elapses, the inert gas MFC 333 is ramped down to zero and the upstream and downstream valves 321 and 322 association with inert gas MFC 333 are closed. Concomitantly, a mixture of CO and $CO_2$ gases 311 and 312 begin to flow. After the upstream and downstream valves 321 and 322 for the CO and $CO_2$ gases 311 and 312 are opened, the CO MFC 331 and $CO_2$ MFC 332 adjust the flow rates of the gases to give an appropriate ratio of the CO and $CO_2$ gases flowing into the tube. Assuming a total gas flow rate of 10 standard liters per minute (slpm) is to flow into the furnace tube 201, the CO gas flow rate may be 1.45 slpm, and the $CO_2$ gas flow rate may be 8.55 slpm. This example is meant to illustrate and not limit the invention. The actual gas flow rates may depend on the substrate 214 size, furnace tube 201 inner diameter, and limitations of the exhausting system (not shown). The total gas flow rate during processing is typically in a range of 5–20 slpm. The temperature is then taken to the denuding temperature that is in a range of 1000–1250 degrees Celsius. The substrates 214 remain at the denuding temperature for a time in a range of about 1–4 hours. The temperature of the furnace tube 201 and substrates 214 is then ramped down. At this point in the process, the denuding is essentially completed and a denuded zone is formed. The depth of the denuded zone is a function of the time and temperature of the denuding step because it is a diffusion controlled process. The denuded zone is at least three microns deep and generally is at least 10 microns deep and generally lies between the bulk of the substrate and the primary surface of the substrate.

Native oxide that may be present on the substrates 214 when they are inserted into the furnace tube 201 is removed from the substrates 214 during the denuding processing step if the oxygen partial pressure is sufficiently low. However, a very thin native oxide may grow during subsequent processing.

During the same furnace cycle but after the denuding step, nucleating and growing steps may be performed. Nucleating sites for precipitates are formed during the nucleating step, and the precipitates are grown from the nucleating sites during the growing step. The precipitates are formed from interstitial oxygen within the bulk of the substrates 214 and form beneath the denuded zone. The precipitation of the oxygen in the bulk of substrates 214 is desired because the precipitates can act as gettering sites. The precipitate formation is also performed to "lock up" interstitial oxygen into the precipitates and reduce the likelihood that interstitial oxygen migrates from the bulk of the substrate into the denuded zone.

After denuding, the temperature of the furnace tube 201 is adjusted to the nucleating temperature, which is in a range about 450–850 degrees Celsius. After reaching the nucleating temperature, the substrates 214 are annealed for a time sufficient to generate nucleating sites. The nucleating time depends on the density of the precipitates desired. Typical nucleating times are in a range of about 1–4 hours. The gas flows during the nucleating step may be different compared to the gas flows during the denuding step. Because denuding has been completed, oxygen may be present. An inert gas (argon, helium, nitrogen, or the like) is typically used during the nucleating step. In addition to the inert gas, an oxidizing bleed (oxygen, ozone, steam, nitric oxide, or nitrous oxide) and/or the $CO/CO_2$ gas combination may be used. The gas and gas flow rate changes may occur just before the temperature is adjusted from the denuding temperature, at any point during the adjustment, or after the furnace and substrates 214 reach the nucleating temperature. The growing step is the process step performed to grow the nuclei to an oxygen precipitate and is achieved by heating the substrates 214 at a temperature higher than the nucleating temperature and is typically higher than 800 degrees Celsius. After the time for growing has elapsed, the substrates 214 may be removed from the furnace tube 201. If CO is used during the growing step, the CO may be turned off and the tube 201 purged prior to removing the substrates 214 from the furnace tube 201.

The three main processing steps include forming a denuded zone with the substrates 214, forming nucleating sites for precipitates, and growing the precipitates. All of the three main processing steps are performed at elevated temperatures, which are herein defined as temperatures higher than 500 degrees Celsius. In this embodiment, all three steps are performed during the same furnace cycle. If CO is used during the last processing step prior to removing the substrates 214 from the furnace tube 201, the furnace tube 201 may need an inert gas purge to remove any residual CO that may be present within the furnace tube 201. The purge should be at least 10 minutes long and usually is at least 20 minutes long.

The substrates 201 are further processed to form semiconductor devices. The denuding, nucleating, and growing steps are typically the first significant thermal processing steps to which the substrates 214 are exposed. The next significant thermal processing step may be performed to form a buried region, an n-well region or a p-well region, an epitaxial layer, or a field isolation process sequence. Conventional processing steps are used for these subsequent steps to form semiconductor devices.

Reducing Reaction

The reaction of CO and oxygen ($O_2$) to form $CO_2$ is:

$$2CO + O_2 \rightleftharpoons 2CO_2$$

The double-headed arrow indicates that the reaction is reversible. The law of mass action gives the following equation:

$$K = \left( \frac{PCO2}{(PCO)*(PO2)^{0.5}} \right)$$

where
K is the equilibrium constant;
PCO2 is the partial pressure of $CO_2$;
PCO is the partial pressure of CO; and
PO2 is the partial pressure of $O_2$.
The equilibrium constant is not truly a constant but varies with temperature. At 1100 degrees Celsius, K is about 1.45E6. Rearranging the terms and using the number for the equilibrium constant gives:

$$PO2 = \left( \frac{PO2}{PCO*1.45E6} \right)^2$$

If the furnace system is operated at atmospheric pressure and the partial pressure of CO is about 0.145 atmosphere and the partial pressure of $CO_2$ is about 0.855 atmosphere, the PO2 is about 1E-11. In other words, performing the denuding at about 1100 degrees Celsius and using about 1.45 slpm of CO and about 8.55 slpm of $CO_2$, the furnace may have an oxygen partial pressure as low as 1E-11 atmosphere, which is about 0.01 parts per billion atomic (ppba) or 10 parts per trillion atomic.

The oxygen concentration in the processing gas during denuding does not exceed 1 ppma, and should not exceed 1 ppba, if possible. At 1100 degrees Celsius and one atmosphere total pressure, the CO partial pressure should be at least about 0.02 atmosphere and the $CO_2$ partial pressure should be no greater than about 0.98 atmospheres to achieve 1 ppba if no other gases are used. For a total flow rate of 10 slpm, the CO MFC 331 would be set for about 0.2 slpm and $CO_2$ MFC 332 would be set for about 9.8 slpm. In other words, there is about one part CO for every 50 parts of $CO_2$.

On the other end of the spectrum, the processing gas may include almost all CO. A small amount of $CO_2$ should be included because the reaction is reversible and additional energy would be needed to initially convert some of the CO to $CO_2$. Practical considerations may limit the amount of CO used. The lower flammability limit of CO in air is 15.5%. In the previous example, the CO is about 14.5% of the processing gas. Therefore, the risk of an explosion is low because the CO concentration in the processing gas is less than 15.5%. The difference between the lower flammability limit in air and the actual composition should account for overshoot by the CO MFC 331 when approaching the set point during the ramping of the CO gas flow rate and should also account for the CO MFC 331 if it is slightly out of calibration.

One way to achieve a relatively high CO partial pressure relative to the $CO_2$ partial pressure is to dilute the gases with an inert gas. For example, the processing gas during denuding may include about 1.45 slpm of CO, about 0.01 slpm of $CO_2$, and about 8.54 slpm of argon. In this case, PCO is about 0.145 atmosphere and PCO2 is about 0.001 atmosphere. Assuming that the denuding is performed at 1100 degrees Celsius, PO2 is about 2E-17, or the oxygen concentration within the furnace tube 201 may be as low as about 20 parts per quintillion atomic during denuding. Even lower oxygen concentrations can be achieved by further increasing the CO to $CO_2$ ratio. In this manner, very low oxygen concentrations may be achieved without operating above the lower flammability limit of CO in air.

In other embodiments, concentrations of CO higher than the lower flammability limit of CO in air (higher than 15.5 percent CO) may be used. Special precautions, such as providing a burn box (not shown) to burn the CO after it leaves the gas outlet 203, may need to be taken. Burn boxes are common to hydrogen alloy processes. Such a burn box may be adapted for use with the furnace system 1 if the CO needs to be burned before it reaches the scrubber (not shown).

Benefits and Options

The embodiments previously described have benefits. A higher quality denuded zone is formed when the oxygen concentration within the furnace tube during the denuding step is low. Using the embodiments of the present invention, the oxygen concentration in the denuded zone after the denuding step should be no higher than about 1 ppma. Conventional denuding processes either use an oxygen bleed or do not include a reducing gas within the processing ambient. The conventional denuding processes have problems that are described within the background section of this specification. Embodiments of the present invention allow an oxygen concentration within the furnace tube 201 so low during denuding that formation of the volatile silicon-oxygen compound is virtually nonexistent. Therefore, the embodiments form a high quality denuded zone with virtually no silicon pits.

The embodiments also have benefits over hydrogen denuding. CO has one of the highest lower flammability limits in air of commonly used flammable gases. The lower flammability limit for CO in air is 15.5 percent, whereas the lower flammability limit for hydrogen in air is 4.65 percent. Therefore, a higher pressure of CO may be used compared to hydrogen and still not form an explosive gas mixture.

Semiconductor fabs utilizes numerous processes which may generate CO, such as trichloroethane and tetraethylorthosilicate (TEOS). The use of CO is typically not a problem. Either the CO can be burned to form $CO_2$ or the vacuum (negative pressure relative to atmosphere) within the scrubber should be sufficient to prevent it from entering operator work areas. CO does not present an usual safety problem that cannot be overcome.

Both CO and $CO_2$ are widely available gases and may be obtained in sufficient purities to allow their use in processing semiconductor substrates. Therefore, the cost of performing the denuding step is not prohibitive. Carbon incorporation into the substrates 214 is expected to be lower than that induced by crystal growth when forming the substrates 214 themselves. Therefore, the use of CO and $CO_2$ should not cause reliability problems.

One option available is to perform the three main steps during more than one furnace cycle or integrate them with other processing steps. In other words, the denuding, nucleating, and growing steps may each be performed during separate furnace cycles. Also, two of the steps may be performed during one furnace cycle, and the other step may be performed during another furnace cycle.

Other steps may be integrated with the nucleating or growing steps. In other words, the nucleating and growing steps are part of a circuit fabrication process in forming semiconductor devices. For example, the denuding of substrates 214 may be performed as a separate furnace cycle. If a buried layer is to be formed within the substrates 214, the denuded substrates may be ion implanted. The next furnace cycle may be performed at a temperature of about 600-650 degrees Celsius. At this temperature, nucleating sites may be formed, and any implant damage during the ion implantation may be annealed. During the same furnace cycle, the temperature may be subsequently ramped to a temperature above 800 degrees Celsius. This portion of the furnace cycle may activate the dopant to form the buried layer and also grow the precipitates. In another example, the denuding and nucleating steps are performed during the same furnace cycle, and the growing step occurs during the subsequent furnace cycle that may form a well region, an epitaxial layer, a pad dielectric layer, or the like. In any event, many options are available.

The source of the CO and $CO_2$ gases may be varied. Gas cylinders, a bulk system (tank), or a pipeline system may be used. In addition, the CO and $CO_2$ gases may be custom mixed and put into a single gas cylinder. In this case, one less gas line would be required, and the MFC used for the custom gas would need to be calibrated or gas flow rates adjusted to account for the gas mixture to insure a proper flow rate.

Other types of substrates may be used. In the previous embodiment, CZ-grown silicon substrates are used. In addition to silicon, other semiconductor materials, such as germanium and the like, may be used. Also, FZ-grown substrates may be used with the process. The FZ-grown substrates typically have lower oxygen concentration compared to CZ-grown substrates, but the embodiments of the present invention may be used to further reduce the oxygen concentration. In general, the oxygen concentration prior to the denuding step is typically 5–50 ppma oxygen. After the step of denuding, the oxygen concentration within the denuded zone is no more than about one part per ppma.

In the foregoing specification, the invention has been described with reference to specific embodiments thereof. However, it will be evident that various modifications and changes can be made thereto without departing from the broader spirit or scope of the invention as set forth in the appended claims. Accordingly, the specification and drawings are to be regarded in an illustrative rather than a restrictive sense.

What is claimed is:

1. A process for forming a denuded zone within a semiconductor substrate comprising the steps of:
   providing the semiconductor substrate having a primary surface and an oxygen concentration in a region adjacent to the primary surface;
   heating the substrate to a first elevated temperature in a reducing ambient that includes carbon-containing molecules to lower the oxygen concentration within the region.

2. The process of claim 1, further comprising steps of:
   adjusting the temperature of the substrate to a second elevated temperature that is lower than the first elevated temperature; and
   maintaining the substrate at the second elevated temperature for a time to form nucleating sites for precipitates, wherein:
   the sites are formed within the bulk of the substrate; and
   the region lies between the bulk and the primary surface.

3. The process of claim 2, wherein the first elevated temperature is at least 1000 degrees Celsius and the second elevated temperature is in a range of 450–850 degrees Celsius.

4. The process of claim 2, wherein:
   at the step of providing, the region has an oxygen concentration of about 5–50 parts per million; and
   after the step of maintaining, the region has an oxygen concentration of less than one part per million.

5. The process of claim 2, further comprising steps of:
   adjusting the temperature of the substrate to a third elevated temperature that is higher than the second elevated temperature; and
   maintaining the substrate at the second elevated temperature to grow precipitates from the nucleating sites.

6. The process of claim 5, wherein the third elevated temperature is at least 800 degrees Celsius.

7. The process of claim 1, wherein the reducing ambient includes carbon monoxide and carbon dioxide.

8. The process of claim 7, wherein the reducing ambient includes at least one part of carbon monoxide for every 50 parts of carbon dioxide.

9. The process of claim 1, wherein the reducing ambient has no higher than one part per million of oxygen.

10. The process of claim 1, wherein the reducing ambient includes a gas selected from a group consisting of argon, helium, nitrogen, and hydrogen.

11. The process of claim 1, wherein the region is at least three microns thick.

12. A process for forming a denuded zone within a silicon substrate comprising the steps of:
    providing the silicon substrate having a primary surface and an oxygen concentration in a region adjacent to the primary surface that is about 5–50 parts per million;
    heating the substrate to a first elevated temperature that is at least 1000 degrees Celsius for about 1–4 hours in a reducing ambient that includes carbon monoxide and carbon dioxide;
    lowering the temperature of the substrate to a second elevated temperature that is about 450–850 degrees Celsius; and
    maintaining the substrate at the second elevated temperature for a time to form nucleating sites for oxygen precipitates within the bulk of the substrate, wherein the region lies between the bulk and the primary surface.

13. The process of claim 12, wherein after the step of maintaining, the region has an oxygen concentration in the region of less than one part per million.

14. The process of claim 12, wherein the reducing ambient includes at least one part of carbon monoxide for every 50 parts of carbon dioxide.

15. The process of claim 12, wherein the reducing ambient has no more than one part per million of oxygen.

16. The process of claim 12, wherein the reducing ambient includes a gas selected from a group consisting of argon, helium, nitrogen, and hydrogen.

17. The process of claim 12, further comprising steps of:
    adjusting the temperature of the substrate to a third elevated temperature that is higher than the second elevated temperature; and
    maintaining the substrate at the second elevated temperature to grow precipitates from the nucleating sites.

18. The process of claim 12, wherein the region is at least three microns thick.

* * * * *